United States Patent
Pu et al.

(10) Patent No.: US 6,610,560 B2
(45) Date of Patent: Aug. 26, 2003

(54) CHIP-ON-CHIP BASED MULTI-CHIP MODULE WITH MOLDED UNDERFILL AND METHOD OF FABRICATING THE SAME

(75) Inventors: Han-Ping Pu, Taipei (TW); Yu-Po Wang, Miaoli (TW); Caesar Lin, Miaoli (TW)

(73) Assignee: Siliconware Precision Industries Co., Ltd. (TW)

( * ) Notice: Subject to any disclaimer, the term of this patent is extended or adjusted under 35 U.S.C. 154(b) by 0 days.

(21) Appl. No.: 09/854,303

(22) Filed: May 11, 2001

(65) Prior Publication Data
US 2002/0167079 A1 Nov. 14, 2002

(51) Int. Cl.[7] .......................... H01L 21/44; H01L 21/48
(52) U.S. Cl. ................ 438/122; 438/120; 438/119; 257/720; 257/723
(58) Field of Search ................ 438/107–118, 119, 438/612, 615, 122, 121; 257/723, 777, 783, 778, 686, 738, 779, 780

(56) References Cited

U.S. PATENT DOCUMENTS

| 5,001,548 A | * | 3/1991 | Iversen ................ 165/80.3 |
| 5,608,262 A | | 3/1997 | Degani et al. ............ 257/723 |
| 5,646,828 A | | 7/1997 | Degani et al. ............ 361/715 |
| 5,724,729 A | * | 3/1998 | Sherif et al. ............. 257/707 |
| 5,872,700 A | * | 2/1999 | Collander ............... 174/260 |
| 5,892,289 A | | 4/1999 | Tokuno .................. 257/783 |
| 5,923,090 A | | 7/1999 | Fallon et al. ............. 257/777 |
| 6,038,136 A | | 3/2000 | Weber .................... 361/783 |
| 6,143,590 A | * | 11/2000 | Ohki et al. ............... 257/705 |
| 6,150,724 A | * | 11/2000 | Wenzel et al. ............. 257/724 |
| 6,251,707 B1 | * | 6/2001 | Bernier et al. ............ 438/118 |
| 6,287,949 B1 | * | 9/2001 | Mori et al. .............. 438/107 |
| 6,297,551 B1 | * | 10/2001 | Dudderar et al. .......... 257/686 |
| 6,396,712 B1 | * | 5/2002 | Kuijk .................... 257/777 |

* cited by examiner

*Primary Examiner*—Michael S. Lebentritt
(74) *Attorney, Agent, or Firm*—Peter F. Corless; Steven M. Jensen; Edwards & Angell, LLP

(57) ABSTRACT

A semiconductor packaging technology is proposed for the fabrication of a chip-on-chip (COC) based multi-chip module (MCM) with molded underfill. The proposed semiconductor packaging technology is characterized by the provision of a side gap of an empirically-predetermined width between the overlying chips mounted through COC technology over an underlying chip to serve as an air vent during molding process. This allows the injected molding material to flow freely into the flip-chip undergaps during molding process. In actual application, the exact width of the side gap is empirically predetermined through molded-underfill simulation experiments to find the optimal value. Based on experimental data, it is found that this side gap width should be equal to or less than 0.3 mm to allow optimal underfill effect. The optimal value for this side gap width may be varied for different package specifications.

9 Claims, 5 Drawing Sheets

CHIP-ON-CHIP BASED MULTI-CHIP MODULE WITH MOLDED UNDERFILL AND METHOD OF FABRICATING THE SAME

BACKGROUND OF THE INVENTION

1. Field of the Invention

This invention relates to semiconductor packaging technology, and more particularly, to a chip-on-chip (COC) based multi-chip module (MCM) with molded underfill and method of fabricating the same.

2. Description of Related Art

Multi-chip module (MCM) is a type of semiconductor package that is used to pack two or more semiconductor chips in one single package unit, so that one single package unit is capable of offering a manifold level of functionality or data storage capacity. Memory chips, such as flash memory chips, are typically packaged in this way so as to allow one single memory module to offer an increased data storage capacity.

A conventional method for fabricating a small-size multi-chip module is through the use of chip-on-chip (COC) technology, by which one semiconductor chip is arranged in an upside-down flip chip manner over the active surface of another chip and bonded to the same by means of an array of solder bumps. The COC technology has the benefit of allowing the finished package unit to have a reduced height.

One problem to the COC architecture, however, is that a flip-chip undergap would be undesirably left between the overlying chip and the underlying chip due to the existence of solder bumps therebetween. This flip-chip undergap, if not underfilled, would easily cause the two chips to suffer from fatigue cracking and electrical failure when the entire package structure is being subjected to high-temperature conditions. As a solution to this problem, it is an essential step in the fabrication of a COC-based multi-chip module to fill an underfill material, such as resin, into such the flip-chip undergap, so as to provide mechanical reinforcement to the two chips. The involved process step is customarily referred to as flip-chip underfill.

A conventional method for fabricating a COC-based multi-chip module is illustratively depicted in the following with reference to FIGS. 1A–1D.

Referring first to FIG. 1A, by this conventional method, the first step is to prepare a circuited substrate 100 and at least three semiconductor chips, including a first semiconductor chip 110, a second semiconductor chip 120, and a third semiconductor chip 130.

The circuited substrate 100 is a conventional and well-known substrate type for BGA application, which has a front surface 100a and a back surface 100b, and whose front surface 100a is used for mounting the chips 110, 120, 130, while the back surface 100b is used for the implantation of a ball grid array (shown later in FIG. 1D with the reference numeral 180).

The first semiconductor chip 110 has an active surface 110a and an inactive surface 110b, and whose inactive surface 110b is adhered to the front surface 100a of the circuited substrate 100 and whose active surface 110a is electrically coupled to the circuited substrate 100 by means of a plurality of bonding wires 111, such as gold wires.

The second semiconductor chip 120 has an active surface 120a and an inactive surface 120b, and whose active surface 120a is mechanically bonded and electrically coupled to the active surface 110a of the first semiconductor chip 110 through COC technology by means of an array of solder bumps 121. As the second semiconductor chip 120 is mounted in position over the first semiconductor chip 110, however, a flip-chip undergap 122 would be undesirably left therebetween due to the existence of the solder bumps 121.

The third semiconductor chip 130 has an active surface 130a and an inactive surface 130b, and whose active surface 130a is also mechanically bonded and electrically coupled to the active surface 110a of the first semiconductor chip 110 through COC technology by means of an array of solder bumps 131. As the third semiconductor chip 130 is mounted in position over the first semiconductor chip 110, however, a flip-chip undergap 132 would be undesirably left therebetween due to the existence of the solder bumps 131.

Referring further to FIG. 1B, in the next step, a flip-chip underfill process is performed to form a flip-chip underfill layer 140 to fill up the entirety of the flip-chip undergaps 122, 132.

Referring further to FIG. 1C, in the next step, a molding process is performed by fixing the semi-finished package assembly of FIG. 1B in a molding tool 150 having a mold injection inlet 151. As the semi-finished package assembly of FIG. 1B is fixed in position in the molding tool 150, a molding material 160, such as epoxy resin, is injected through the mold injection inlet 151 into the molding tool 150 until the molding material 160 substantially fills up all the void spaces in the molding tool 150.

Referring further to FIG. 1D, through the forgoing molding process, an encapsulation body 170 is formed to encapsulate all the semiconductor chips 110, 120, 130 over the circuited substrate 100. After this, a ball-implantation process is performed to implant an array of solder balls (i.e., ball grid array) 180 over the back surface 100b of the circuited substrate 100. This completes the fabrication of the multi-chip module by the conventional method.

One drawback to the forgoing conventional method, however, is that, since the flip-chip underfill layer 140 is different in coefficient of thermal expansion (CTE) from the encapsulation body 170, it would easily cause the breaking of the bonding wires 111 during subsequent TCT (Temperature Cycle Test) or TST (Thermal Shock Test) testing procedures.

Some related patents are listed in the following:

U.S. Pat. No. 6,038,136 "CHIP PACAKGE WITH MOLDED UNDERFILL";

U.S. Pat. No. 5,923,090 "MICROELECTRONIC PACAKGE AND FABRIATION THEREOF";

U.S. Pat. No. 5,892,289 "BARE CHIP MOUNTING STRUCTURE AND MANUFACTURING METHOD THEREFOR";

U.S. Pat. No. 5,646,828 "THIN PACKAGING OF MULTI-CHIP MODULES WITH ENHANCED THERMAL POWER MANAGEMENT";

U.S. Pat. No. 5,608,262 "PACKAGING MULTI-CHIP MODULES WITHOUT WIRE-BOND INTERCONNECTION".

The U.S. Pat. No. 6,038,136 teaches the provision of a vent hole in the substrate to help the molding material to fill freely into the flip-chip undergaps to form a molded underfill layer. One drawback to this patent, however, is that the drilling of a vent hole in the substrate of each package unit would make the overall packaging process more complex in procedural steps. The U.S. Pat. No. 5,923,090, No. 5,892,289, No. 5,646,828, and No. 5,608,262 disclose various types of COC technologies. However, none of them teach a cost-effective solution to the problem of molded underfill.

SUMMARY OF THE INVENTION

It is therefore an objective of this invention to provide a new semiconductor packaging technology for fabrication of COC-based multi-chip module with molded underfill, which can help prevent the bonding wires from breaking during TCT or TST testing procedures.

In accordance with the foregoing and other objectives, the invention proposes a new semiconductor packaging technology for fabrication of COC-based multi-chip module.

The new semiconductor packaging technology according to the invention is characterized by the provision of a side gap of an empirically-predetermined width between the overlying chips mounted through COC technology over an underlying chip to serve as an air vent which allows the injected molding material to fill freely into the flip-chip undergaps during molding process.

Fundamentally, the underfill effect is related to a number of factors, including the flowability of the molding material, the size of the overlying chips, and the quantity of the solder bumps. Therefore, in actual application, the exact width of the side gap should be determined empirically through experiments.

Based on experimental data, it is found that the width of the side gap should be equal to or less than 0.3 mm (millimeter). The optimal value for the side gap width may be varied for different package specifications. For instance, in the case of the overlying chips being 3.5 mm×1.8 mm in size, it is found that a side gap width of 0.16 mm would allow the optimal underfill effect, i.e., it allows the molding material to substantially fill up all the entirety of the flip-chip undergaps.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

A preferred embodiment of the new semiconductor packaging technology according to the invention for fabrication of a COC-based multi-chip module with molded underfill is disclosed in full details in the following with reference to FIGS. 2A–2D.

Figure 1A:
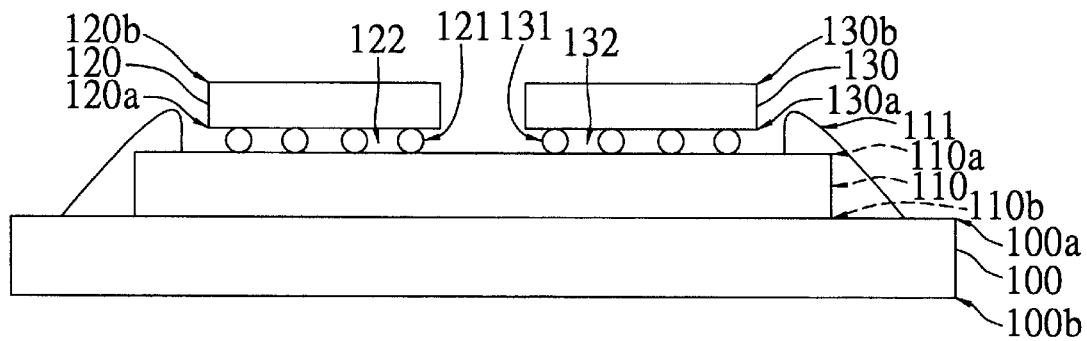
FIGS. 1A–1D (PRIOR ART) are schematic sectional diagrams used to depict a conventional method for fabricating a COC-based multi-chip module.
Figure 1B:
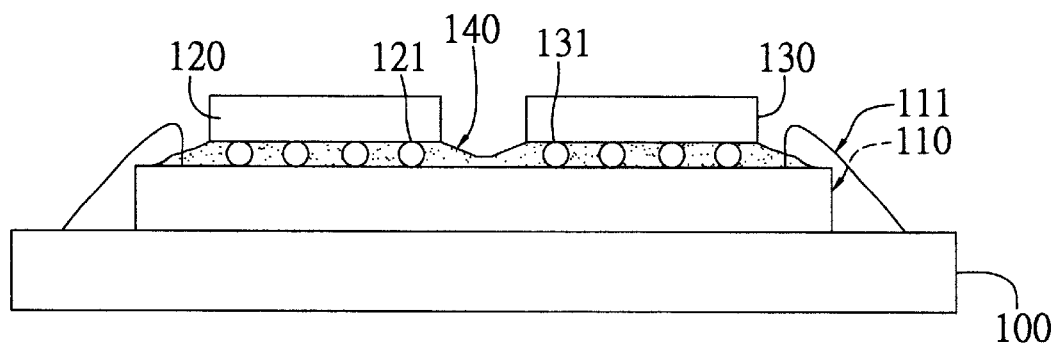
Figure 1C:
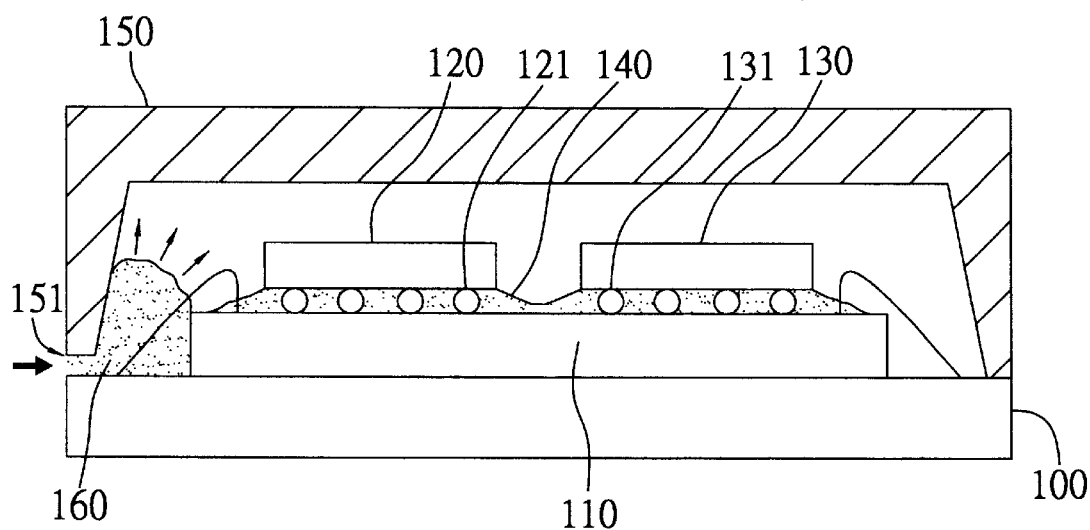
Figure 1D:
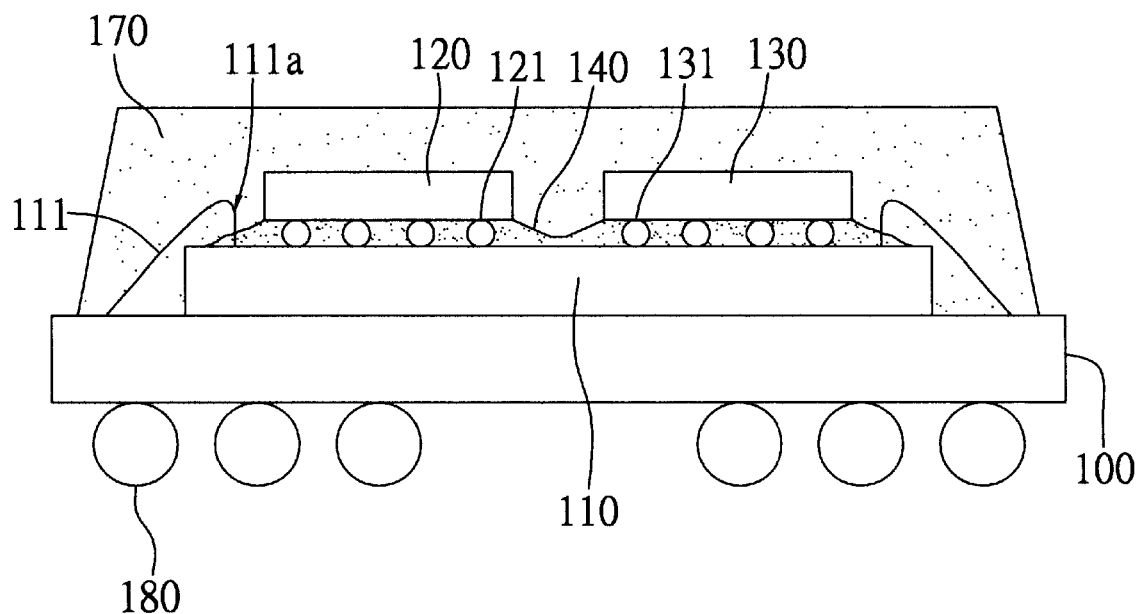
Figure 2A:
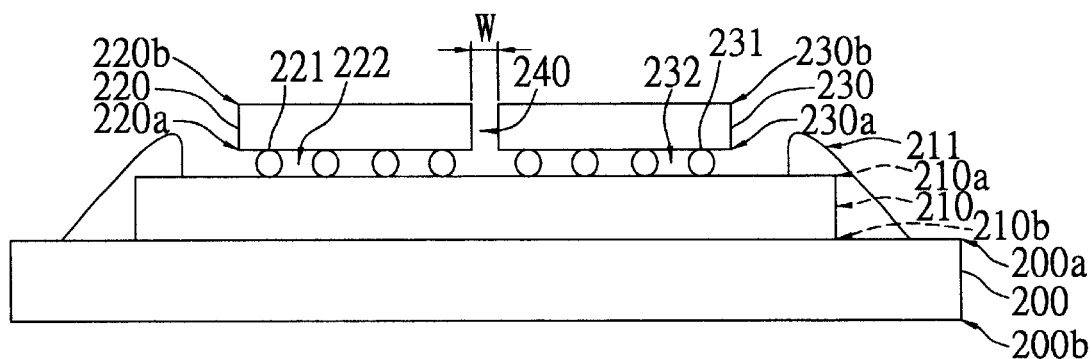
FIGS. 2A–2D are schematic sectional diagrams used to depict the procedural steps involved in the method according to the invention for fabricating a COC-based multi-chip module with molded underfill.

Referring first to FIG. 2A, by the method of the invention, the first step is to prepare a circuited substrate 200 and at least three semiconductor chips, including a first semiconductor chip 210, a second semiconductor chip 220, and a third semiconductor chip 230.

The circuited substrate 200 is a conventional and well-known substrate type for BGA application, which has a front surface 200a and a back surface 200b, and whose front surface 200a is used for mounting the chips 210, 220, 230, while the back surface 200b is used for the implantation of a ball grid array (shown later in FIG. 2C and FIG. 2D with the reference numeral 280).

The first semiconductor chip 210 has an active surface 210a and an inactive surface 210b, and whose inactive surface 210b is adhered to the front surface 200a of the circuited substrate 200 and whose active surface 210a is electrically coupled to the circuited substrate 200 by means of a plurality of bonding wires 211, such as gold wires.

The second semiconductor chip 220 has an active surface 220a and an inactive surface 220b, and whose active surface 220a is mechanically bonded and electrically coupled to the active surface 210a of the first semiconductor chip 210 through COC technology by means of an array of solder bumps 221. As the second semiconductor chip 220 is mounted in position over the first semiconductor chip 210, however, a flip-chip undergap 222 would be undesirably left therebetween due to the existence of the solder bumps 221.

The third semiconductor chip 230 has an active surface 230a and an inactive surface 230b, and whose active surface 230a is mechanically bonded and electrically coupled to the active surface 210a of the first semiconductor chip 210 through COC technology by means of an array of solder bumps 231. As the third semiconductor chip 230 is mounted in position over the first semiconductor chip 210, however, a flip-chip undergap 232 would be undesirably left therebetween due to the existence of the solder bumps 231.

It is an important aspect of the invention that the second semiconductor chip 220 and the third semiconductor chip 230 should be arranged in such a manner as to leave a side gap 240 of an empirically-predetermined width W therebetween. The exact value for this width W of the side gap 240 is predetermined through a molded-underfill simulation experiment, which will be described in more details later in this section.

Figure 2B:
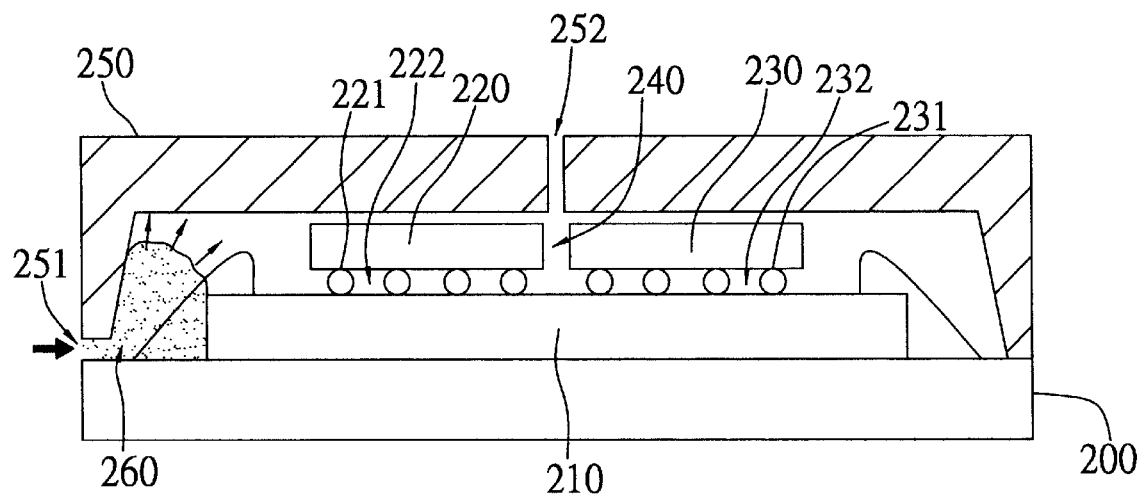

Referring further to FIG. 2B, in the next step, a molding process is performed by fixing the semi-finished package assembly of FIG. 2A in a molding tool 250 having a mold injection inlet 251 and an air outlet 252, wherein the air outlet 252 is aligned to the side gap 240 between the two overlying chips 220, 230, and the inactive surfaces 220b, 230b of the two overlying chips 220, 230 are abutted to the ceiling of the molding tool 250.

With the foregoing setup, a molding material 260, such as epoxy resin, is injected through the mold injection inlet 251 into the molding tool 250. As the molding material 260 is being injected into the molding tool 250, it will gradually fill all the void spaces in the molding tool 250. Owing to the provision of the side gap 240, the air in the flip-chip undergaps 222, 232 can be expelled to escape through the side gap 240 and subsequently through the air outlet 252 to the outside, thereby allowing the injected molding material 260 to flow freely into the flip-chip undergaps 222, 232 to achieve molded underfill.

Figure 2C:
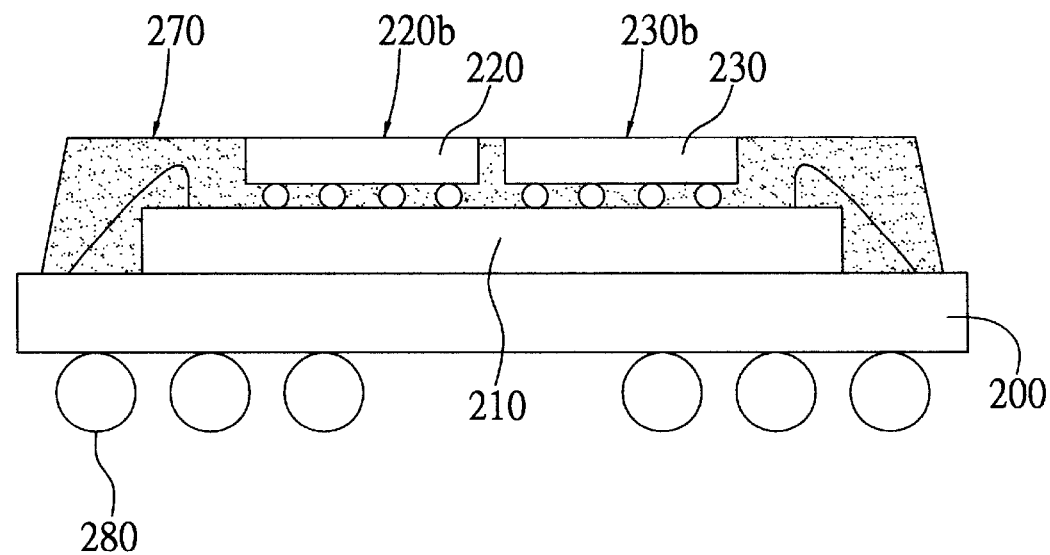

Referring further to FIG. 2C, through the forgoing molding process, an encapsulation body 270 is formed to encapsulate all the semiconductor chips 210, 220, 230 over the circuited substrate 200. In addition, this encapsulation body 270 also provide molded underfill in the flip-chip undergaps 222, 232 between the first semiconductor chip 210 and the overlying semiconductor chips 220, 223. Subsequently, a ball-implantation process is performed to implant an array of solder balls (i.e., ball grid array) 280 over the back surface 200b of the circuited substrate 200.

Figure 2D:
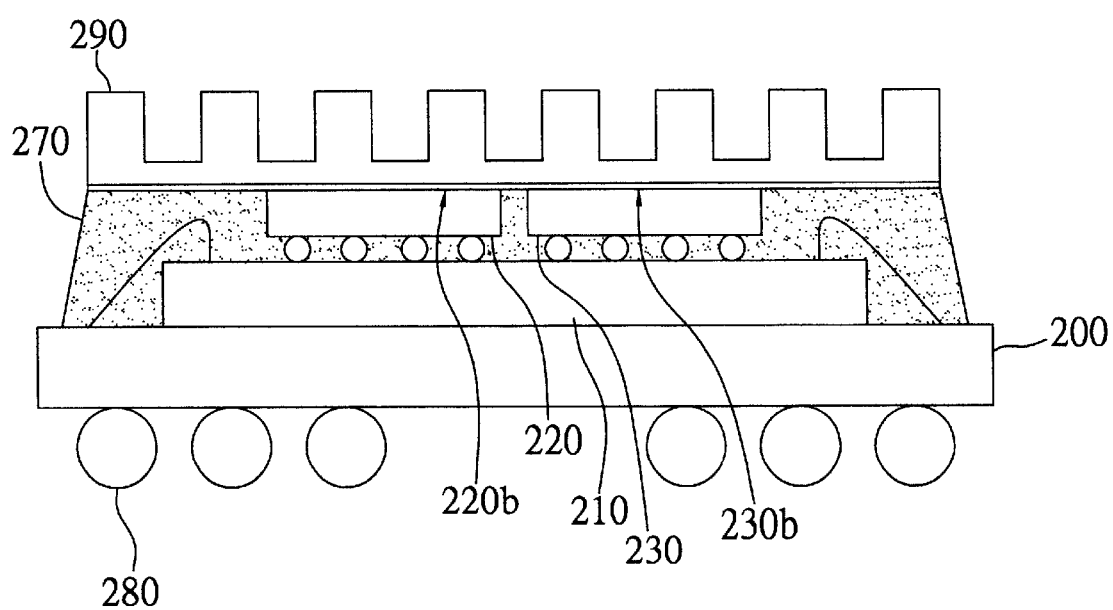

Referring further to FIG. 2D, since the inactive surfaces 220b, 230b of the overlying chips 220, 230 are exposed to the outside of the encapsulation body 270, a heat sink 290 can be optionally coupled thereto so as to help increase the heat-dissipation efficiency of the multi-chip module. This completes the fabrication of the COC-based multi-chip module by the method of the invention.

In conclusion, the invention provides a new semiconductor packaging technology for fabrication of COC-based multi-chip module with molded underfill, which is characterized by the provision of the side gap 240 of an empirically-predetermined width W between the overlying chips 220, 230 to serve as an air vent during the molding process, allowing the injected molding material 260 to flow freely into the flip-chip undergaps 222, 232 to achieve molded underfill.

Fundamentally, the underfill effect is related to a number of factors, including the flowability of the molding material 260, the size of the overlying chips 220, 230, and the quantity of the solder bumps 221, 231. Therefore, in the application of the invention, the exact width W of the side gap 240 should be empirically predetermined through molded-underfill simulation experiments based on the actual package specifications.

Figure 3A:
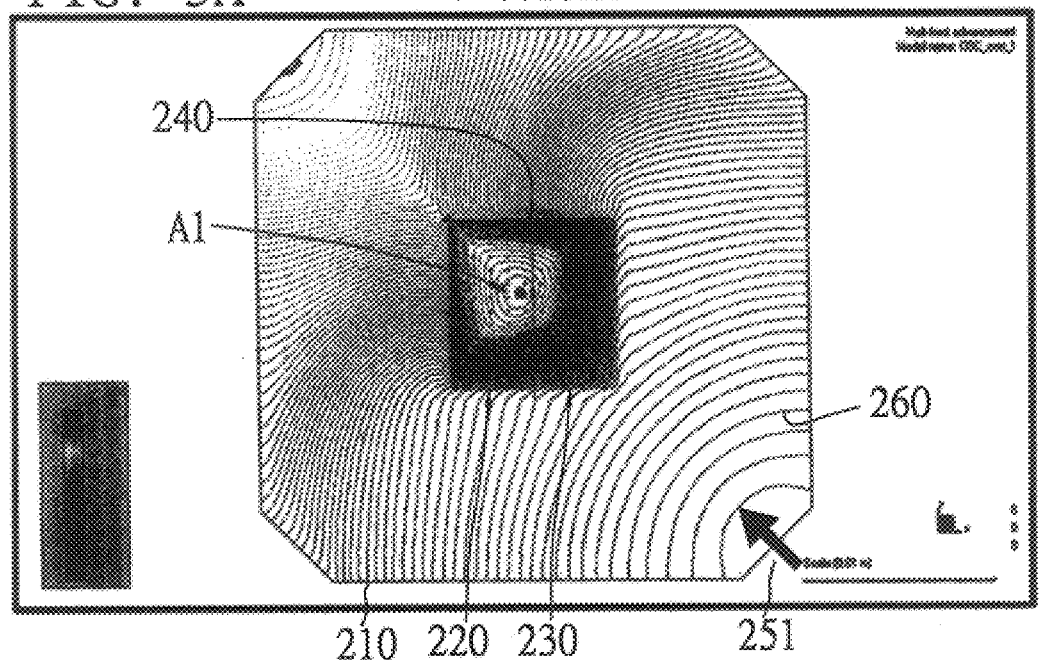
FIGS. 3A–3B show two examples of the results of molded-underfill simulation experiments for different side gap widths.
Figure 3B:
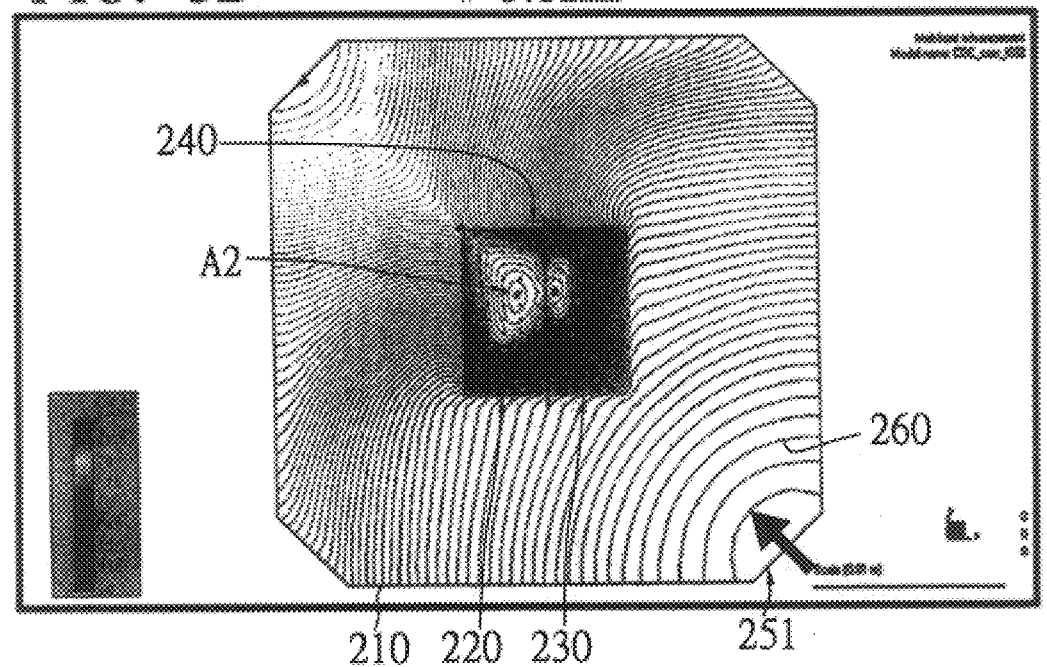

FIGS. 3A–3B show two examples of the results of molded-underfill simulation experiments for different side gap widths; wherein FIG. 3A shows the case of W=0.16 mm, while FIG. 3B shows the case of W=0.32 mm.

In the illustration of FIG. 3A for the case of W=0.16 mm, the reference numeral A1 indicates the center of an air bubble that is being expelled from the flip-chip undergaps 222, 232 of the overlying chips 220, 230 by the injected molding material 260. In this case, since the air bubble A1 at this moment is located near and moving toward the side gap 240, it would be then drained through the side gap 240, allowing the molding material 260 to substantially fully fill up the flip-chip undergap 222, 232 of the overlying chips 220, 230.

In the illustration of FIG. 3B for the case of W=0.32 mm, the reference numeral A2 indicates the center of an air bubble that is being expelled from the flip-chip undergaps 222, 232 of the overlying chips 220, 230 by the injected molding material 260. In this case, since the air bubble A2 at this moment is located near the center of the second chip 220, it would be trapped in the flip-chip undergap 222 of the second chip 220, making the molded underfill result for the second chip 220 unsatisfactory.

Based on experimental results, it is found that the width W of the side gap 240 should be W≦0.3 mm (millimeter); otherwise, it would hardly allow the injected molding material 260 to fill up the entirety of the flip-chip undergaps 222, 232. The optimal value for W may be varied for different package specifications. For instance, in the case of the overlying chips 220, 230 being 3.5 mm×1.8 mm in size, it is found from experimental data that that W=0.16 mm would provide the optimal underfill effect that allows the molding material 260 to substantially fill up all the entirety of the flip-chip undergaps 222, 232. Therefore, in the utilization of this invention, it is required to perform experiments based on the actual package specifications to find the optimal value for W.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method for fabricating a multi-chip module, comprising the steps of:
   (1) preparing a substrate and at least three semiconductor chips, including a first semiconductor chip, a second semiconductor chip, and a third semiconductor chip;
   wherein the substrate having a front surface and a back surface; while the first semiconductor chip, the second semiconductor chip, and the third semiconductor chip each having an active surface and an inactive surface;
   (2) mounting the second semiconductor chip and the third semiconductor chip over the first chip through COC technology, wherein a side gap of an empirically-predetermined width through a molded-underfill simulation experiment is left between the second semiconductor chip and the third semiconductor chip; and
   (3) mounting the first semiconductor chip on the substrate and electrically coupled to the substrate through wire-bonding technology;
   (4) performing a molding process,
   wherein
      the substrate is fixed in a molding tool having a mold injection inlet and an air outlet, with the air outlet of the molding tool being aligned to the side gap between the second semiconductor chip and the third semiconductor chip; and then
      a molding material is injected into the molding tool through the mold injection inlet for the purpose of forming an encapsulation body to encapsulate the first semiconductor chip, the second semiconductor chip, and the third semiconductor chip; the encapsulation body including a molded underfill layer in the flip-chip undergaps of the second semiconductor chip and the third semiconductor chip.

2. The method of claim 1, wherein in said step, the empirically-predetermined width of the side gap between the second semiconductor chip and the third semiconductor chip is equal to or less than 0.3 mm.

3. The method of claim 2, wherein in the case of the second semiconductor chip and the third semiconductor chip being 3.5 mm×1.8 mm in size, the width of the side gap is 1.6 mm.

4. The method of claim 1, wherein in said step (4), the inactive surfaces of the second semiconductor chip and the third semiconductor chip are exposed to the outside of the encapsulation body.

5. The method of claim 4, further comprising the step of:
   attaching a heat sink to the exposed inactive surfaces of the second semiconductor chip and the third semiconductor chip.

6. A multi-chip module, which comprises:
   (a) a substrate;
   (b) a first semiconductor chip mounted over the substrate and electrically coupled to the substrate through wire-bonding technology;
   (c) a second semiconductor chip mounted over the first semiconductor chip through COC technology, with a flip-chip undergap existing between the second semiconductor chip and the first semiconductor chip;
   (d) a third semiconductor chip mounted over the first semiconductor chip through COC technology, with a flip-chip undergap existing between the second semiconductor chip and the first semiconductor chip, the third semiconductor chip being arranged in such a manner as to leave a side gap of an empirically-predetermined width through a molded-underfill simulation experiment between the third semiconductor chip and the second semiconductor chip, wherein the empirically-predetermined width is equal to or less than 0.3 mm; and (e) an encapsulation body for encapsulating the first semiconductor chip, the second semiconductor chip, and the third semiconductor chip, and which includes a molded underfill layer in the flip-chip undergaps of the second semiconductor chip and the third semiconductor chip.

7. The multi-chip module of claim 6, wherein in the case of the second semiconductor chip and the third semiconductor chip begins 3.5 mm×1.8 mm in size, the empirically-predetermined width of the side gap is 0.16 mm.

8. The multi-chip module of claim 6, wherein the inactive surfaces of the second semiconductor chip and the third semiconductor chip are exposed to the outside of the encapsulation body.

9. The multi-chip module of claim 8, further comprising:

a heat sink thermally coupled to the exposed inactive surfaces of the second semiconductor chip and the third semiconductor chip.

* * * * *